US006823095B2

United States Patent
Stegmüller

(10) Patent No.: US 6,823,095 B2
(45) Date of Patent: Nov. 23, 2004

(54) OPTOELECTRONIC DEVICE

(75) Inventor: Bernhard Stegmüller, Augsburg (DE)

(73) Assignee: Infineon Technologies AG, Munich (DE)

( * ) Notice: Subject to any disclaimer, the term of this patent is extended or adjusted under 35 U.S.C. 154(b) by 122 days.

(21) Appl. No.: 10/339,244

(22) Filed: Jan. 9, 2003

(65) Prior Publication Data

US 2003/0152310 A1 Aug. 14, 2003

(30) Foreign Application Priority Data

Jan. 9, 2002 (DE) ............................. 102 01 103

(51) Int. Cl.[7] ............................................. G02B 6/12
(52) U.S. Cl. ................................. 385/14; 385/3; 385/8; 372/50; 359/248
(58) Field of Search ............................ 385/1–3, 8, 14; 372/26, 50; 359/245, 248

(56) References Cited

U.S. PATENT DOCUMENTS

| 5,680,411 A | * | 10/1997 | Ramdane et al. ............. 372/50 |
| 5,811,838 A | * | 9/1998 | Inomoto ................... 372/50 X |
| 6,574,260 B2 | * | 6/2003 | Salvatore et al. ............. 372/50 |

FOREIGN PATENT DOCUMENTS

| DE | 196 00 194 A1 | 11/1996 |
| DE | 196 24 514 C1 | 7/1997 |

OTHER PUBLICATIONS

Alexandre, F. et al.: "Butt–Coupled Waveguide–Modulators by Low Temperature Embedded CBE Regrowth for High Speed Modulation (42GHz) or Large Extinction Ratio (50dB)", IEEE, 1997, pp. 621–624.

Ramdane, A. et al.: "Monolithic Integration of Multiple–Quantum–Well Lasers and Modulators for High–Speed Transmission", IEEE Journal of Selected Topics in Quantum Electronics, vol. 2, No. 2, Jun. 1996, pp. 326–335.

* cited by examiner

*Primary Examiner*—Phan T. H. Palmer
(74) *Attorney, Agent, or Firm*—Laurence A. Greenberg; Werner H. Stemer; Gregory L. Mayback

(57) ABSTRACT

An optoelectronic component has at least one monolithically integrated laser diode and at least one monolithically integrated optical waveguide. At least one of the optical waveguides is functionally coupled to at least two electro-absorption modulators, and at least one electro-absorption modulator is assigned at least one optical amplifier. The assembly forms an active electro-optical device that can be driven efficiently.

13 Claims, 5 Drawing Sheets

OPTOELECTRONIC DEVICE

BACKGROUND OF THE INVENTION

Field of the Invention

The invention pertains to an optoelectronic component having at least one monolithically integrated laser diode and at least one monolithically integrated optical waveguide.

Electro-optical data transmission with high data transmission rates (e.g. >10 Gbit/s) requires a fast intensity control of the light sources. Since the intensity control is not possible using laser diodes alone, electro-optical modulators (e.g. electro-absorption modulators) are used. The voltage changes for driving the modulators cannot be provided by silicon-based controllers (drivers), particularly not at high data transmission rates. Moreover, a high signal level with a high contrast or a high extinction ratio is necessary for reliable data transmission.

These different requirements are taken into account only incompletely by the prior art.

In order to reduce the required voltage changes during the driving, it has become known, in principle, to use a tandem structure of electroabsorption modulators (F. Alexandre, et al. "Butt-coupled waveguide-modulators by low temperature embedded CBE regrowth for high speed modulation (43 GHz) for large extinction ratio (>50 dB), Proc. InP and Rel. Material, 1997 Intern. Conference, May 11–15, 1997, pp. 621–24). However, this tandem structure has only been realized in principle as an experimental construction, and not for providing a monolithically integrated optoelectronic device.

SUMMARY OF THE INVENTION

It is accordingly an object of the invention to provide an optoelectronic component, which overcomes the above-mentioned disadvantages of the heretofore-known devices and methods of this general type and which provides for an active electro-optical device that can be driven efficiently.

With the foregoing and other objects in view there is provided, in accordance with the invention, an optoelectronic component, comprising:

at least one monolithically integrated laser diode;

a plurality of electro-optical modulators, preferably electro-absorption modulators;

at least one monolithically integrated optical waveguide functionally coupled to at least two of the electro-optical modulators; and at least one optical amplifier assigned to at least one of the electro-optical modulators.

The functional coupling of an optical waveguide to at least two electro-optical modulators, in particular electroabsorption modulators, makes it possible for the electroabsorption modulators to be made relatively short. This has the advantage that the capacitances of the electroabsorption modulators are negligible in comparison with the capacitances of possible leads (e.g. traveling wave contacts). It is thus possible to separate the dimensioning and the arrangement of the electrical waveguides and of the optical waveguides from one another. In this case, at least one electroabsorption modulator is assigned at least one optical amplifier since losses in the electroabsorption modulator can thus be compensated for.

In this case, it is advantageous if at least two electro-absorption modulators are arranged along the optical waveguide.

In order to compensate for losses, it is also advantageous if at least one optical amplifier is arranged between two electroabsorption modulators and/or an optical amplifier is arranged at the end of the optical waveguide.

In an advantageous refinement of the invention, at least one of the electroabsorption modulators is connected to an electronic control circuit via a traveling wave contact.

It is particularly advantageous if the length of the electroabsorption modulators is equal to or shorter than the length of the optical amplifiers. Short electroabsorption modulators have the effect that the capacitance becomes smaller than that of the leads, so that a decoupling of electrical and optical lines is possible.

In this case, it is advantageous if at least one electroabsorption modulator has a length of less than 150 μm.

In an advantageous manner, at least one optical waveguide and at least one electrical waveguide are arranged on different substrates.

It is advantageous that the monolithically integrated components, in particular electroabsorption modulators, optical amplifiers and/or laser diodes have the material systems InGaAsP/InP, InGaAlAs/InP, InGaAsN/GaAs or InGaAlAs/GaAs. These systems are well suited in particular to operation at high frequencies.

It is advantageous that the monolithically integrated components, in particular electroabsorption modulators, optical amplifiers and/or laser diodes, are functionally coupled via a common active layer.

In an advantageous manner, the active layer has multiple quantum well structures of different quantum well types, which can thus be set to the respective operating conditions. Quantum dot structures can also advantageously be used. For more information concerning quantum well and quantum dot structures and other related information, see my copending, concurrently filed application Nos. 10/339,243, 10/339,242 and 10/339,232 [Atty. dockets M&N-IT-410, M&N-IT-412, and M&N-IT-413], the disclosures of which are herewith incorporated by reference.

Other features which are considered as characteristic for the invention are set forth in the appended claims.

Although the invention is illustrated and described herein as embodied in an optoelectronic device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
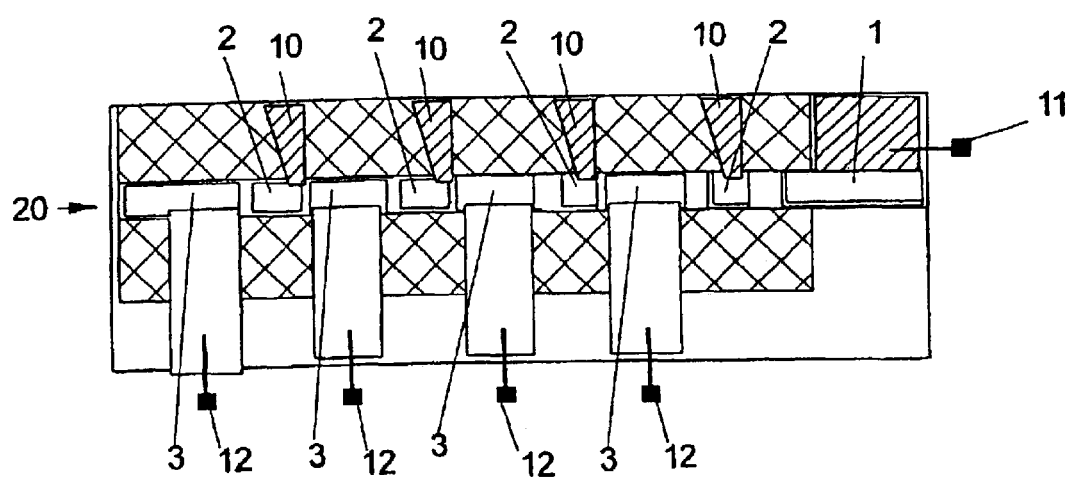
FIG. 1 is a diagrammatic plan view of a first embodiment of an optoelectronic component according to the invention.

Referring now to the figures of the drawing in detail and first, particularly, to FIG. 1 thereof, there is shown a plan view of a first embodiment of an optoelectronic component according to the invention. Arranged in the center along the waveguide 20 is a sequence of optoelectronic components of the device, namely, from right to left: a laser diode 1 (in this case with a DFB structure, alternatively possible also with a DBR structure or a photonic crystal structure), an electro-absorption modulator 2 and an optical amplifier 3.

Then there follow, to the left, pairs of an electroabsorption modulator 2 and an optical amplifier 3 each.

A cascaded arrangement of electroabsorption modulators 2 and optical amplifiers 3 is thus present. The optical amplifiers 3 serve for compensating for optical losses in the electroabsorption modulators 2 or in the interspaces of the components. In principle, however, it is also possible for two electroabsorption modulators 2 to be functionally coupled to the waveguide 20, i.e. without optical amplifiers.

The cascaded arrangement makes it possible to perform the required modulations of the light in shorter electroabsorption modulators 2 (in this case e.g. less than 150 µm), which leads to a reduction of the capacitance of the electroabsorption modulators 2. If the electroabsorption modulators 2 are very short, correspondingly more pairs of electroabsorption modulators 2 and optical amplifiers 3 have to be used in order to obtain a sufficiently high signal contrast and a high signal level.

Figure 3:
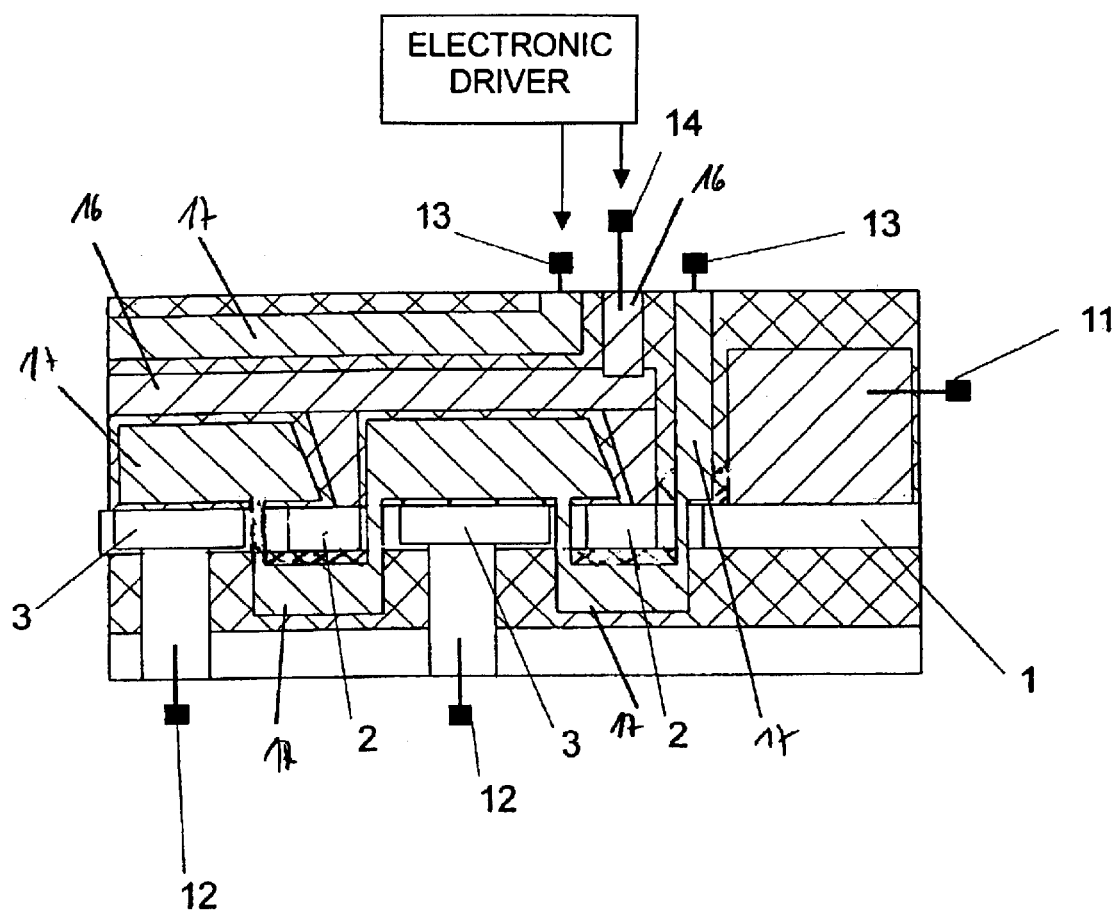
FIG. 3 is a diagrammatic plan view of a third embodiment of an optoelectronic component according to the invention.

The electroabsorption modulators 2 are individually laterally connected by stubs 10 to traveling wave contacts to an RF controller (driver)—diagrammatically illustrated in FIG. 3—for driving the device and arranged on another substrate.

If the electroabsorption modulators 2 are so short that the capacitances of the electroabsorption modulators 2 are negligible, the electrical and optical waveguides can be dimensioned and arranged separately. In this case, the optoelectronic components can be arranged on a conductive substrate, which is simpler for production. Conductive substrates are less suitable, however, for the production of traveling wave contact structures. The possibility of spatially decoupling the optical and electrical waveguides yields greater design freedom.

The device has a width of more than 300 µm transversely with respect to the waveguide 20; the waveguide 20 itself has a width of approximately 2 µm. The laser diode 1 has a length of approximately 200 µm, the electroabsorption modulator 2 has a length of less than 50 µm, and the optical amplifier 3 has a length of less than 100 µm.

In principle, it is advantageous to embody the optical amplifiers 3 with the same length as the electroabsorption modulators 2 or longer by up to a factor of two. In principle, it is also possible for the individual components to be embodied with different lengths.

These measurements and dimensions are substantially applicable to the other embodiments as well.

Furthermore, the illustration shows a positive electrical laser contact 11, and positive electrical contacts 12 for the optical amplifiers 3.

Even though these examples explicitly use an electroabsorption modulator, an electro-optical modulator can nonetheless be used, in principle.

Figure 2A:
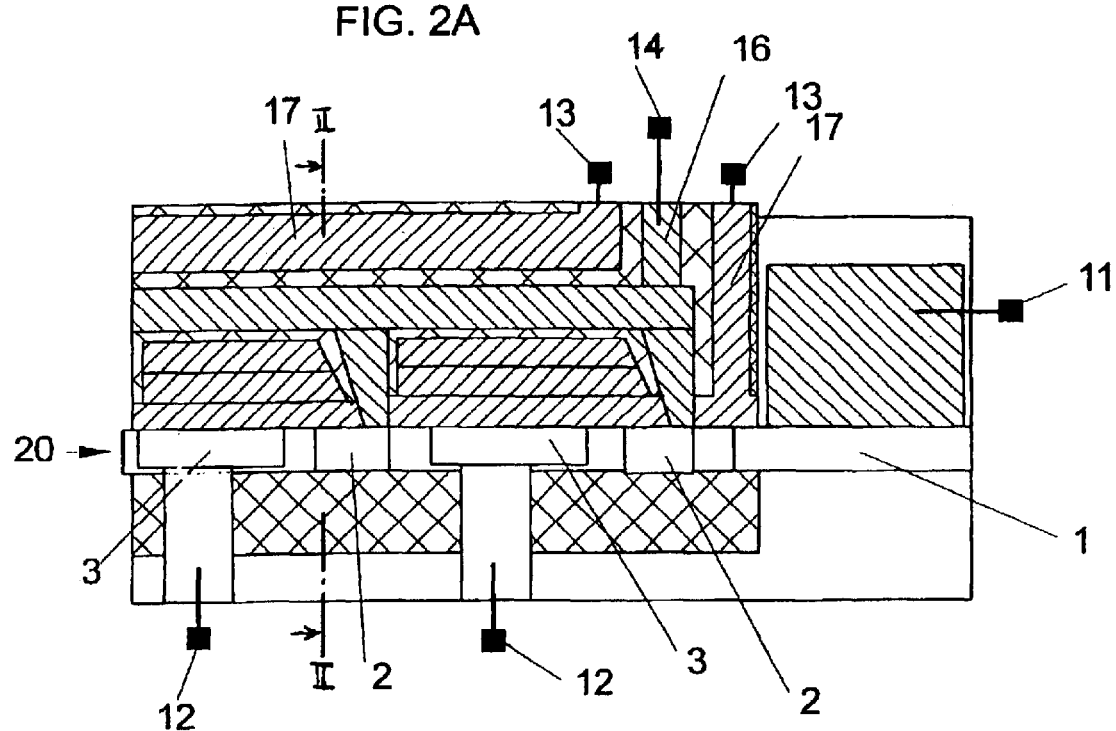
FIG. 2A is a diagrammatic plan view of a second embodiment of the optoelectronic component according to the invention.
Figure 2B:
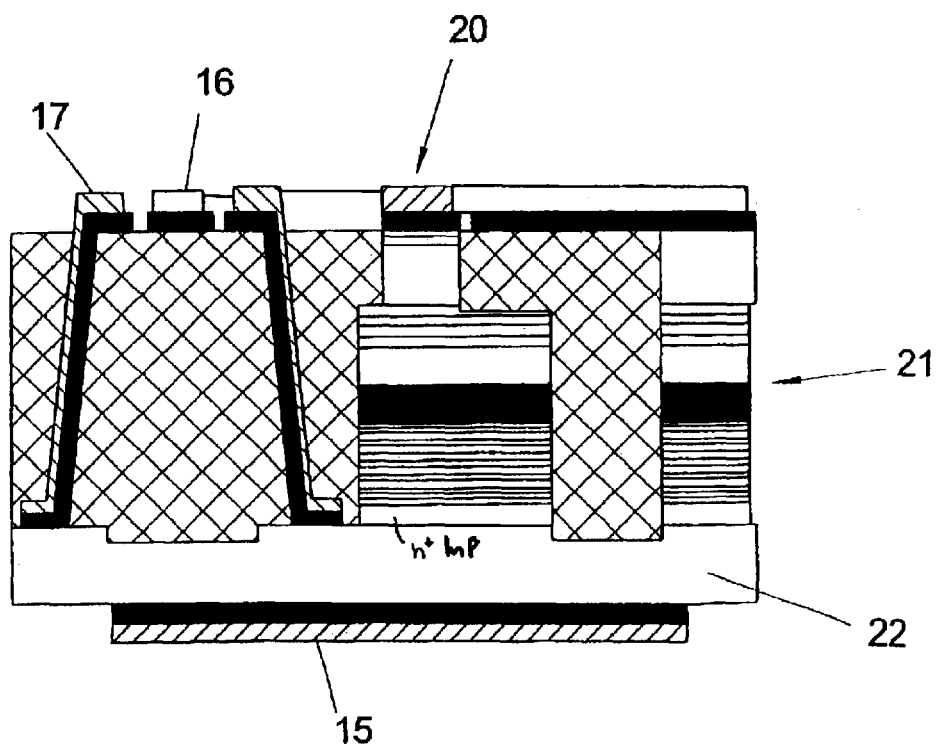
FIG. 2B is a sectional view along the line II—II in FIG. 2A.

FIG. 2A and FIG. 2B illustrate a second exemplary embodiment, wherein the connection to the controller is configured differently than in the first embodiment. The fundamental arrangement of the laser diode 1, of the electroabsorption modulators 2 and of the optical amplifiers 3 is analogous to FIG. 1, so that reference can be made to the description with respect thereto.

In contrast to the first embodiment, however, here the type of leads to the electroabsorption modulators 2 is embodied differently, namely two of the electro-absorption modulators 2 are connected jointly. In this case, a coplanar lead 16 serves for driving the electroabsorption modulators 2 (signal, negative). A connection 14 serves for connecting the coplanar lead 16 to an RF controller.

The lead 16 is insulated from the ground connecting lines 17. The ground connecting lines 17 are connected under the electroabsorption modulator leads 16.

The contact layers are shown in a partially sectional illustration in FIG. 2B. The non-sectional leads to the electroabsorption modulator 2 and the optical amplifier 3 are indicated in FIG. 2B.

FIG. 3 illustrates a third embodiment of the optoelectronic device, which represents a modification of the second embodiment. In this case, the ground connecting leads 17 are arranged "in meandering form" around the electroabsorption modulators 2. Otherwise the description of FIG. 2a applies analogously.

Figure 4:
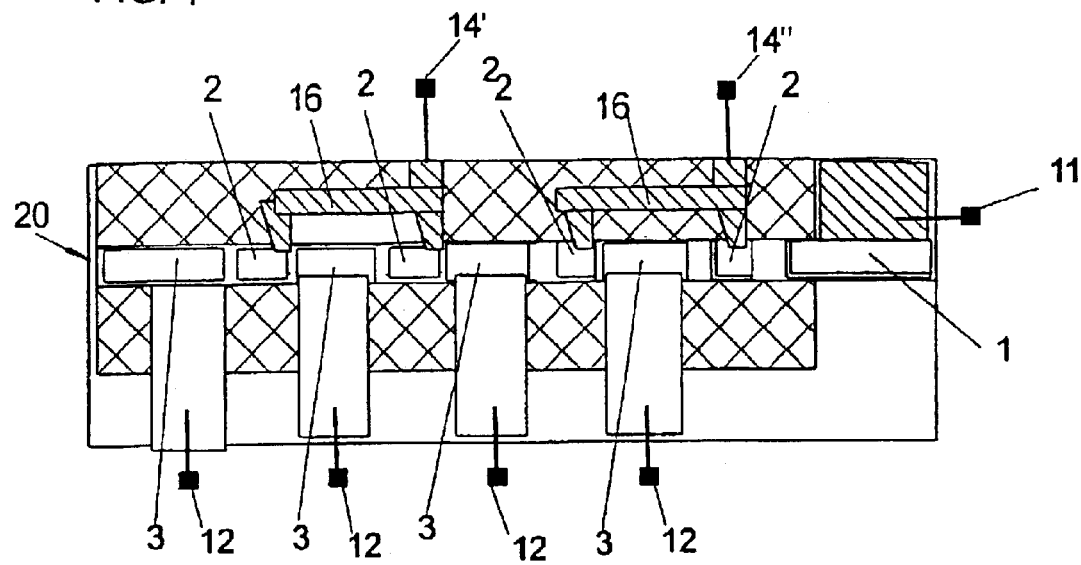
FIG. 4 is a diagrammatic plan view of a fourth embodiment of an optoelectronic component according to the invention.

FIG. 4 illustrates a fourth embodiment, wherein two electroabsorption modulators 2 in each case are jointly contact-connected via leads 16 and two each are arranged in series. Signals (signal 1 negative, signal 2 negative) are fed via the connections 14', 14". The signals fed via the connections 14', 14" may be different in this case.

In principle, it is also possible in each case for more than two electroabsorption modulators 2 to be contact-connected and it is also possible for more than two in each case to be connected in series. Consequently, it is also possible to use more than two different signals for driving the electroabsorption modulators.

Figure 5:
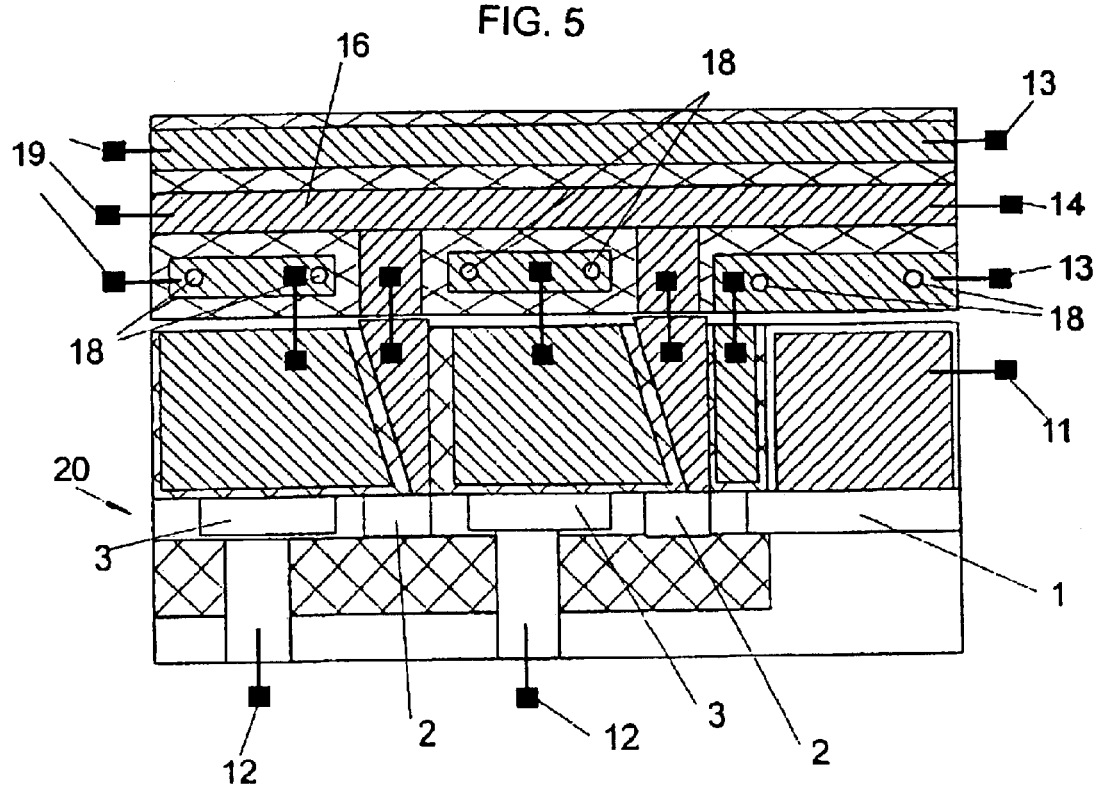
FIG. 5 is a diagrammatic plan view of a fifth embodiment of an optoelectronic component according to the invention.

FIG. 5 shows a fifth embodiment, wherein the electroabsorption modulators 2 are driven via an electrical traveling-wave waveguide 16. The connections to the RF controller (on the right in FIG. 5) are formed analogously to FIG. 3. Connections 19 to the RF terminating resistor are arranged on the right-hand side of FIG. 5.

This embodiment is furthermore provided with contact holes 18 to the substrate underside (metal contact).

The fifth embodiment has a hybrid integrated design which can be used, as an alternative, for monolithic integration. This may afford cost advantages.

Figure 6:
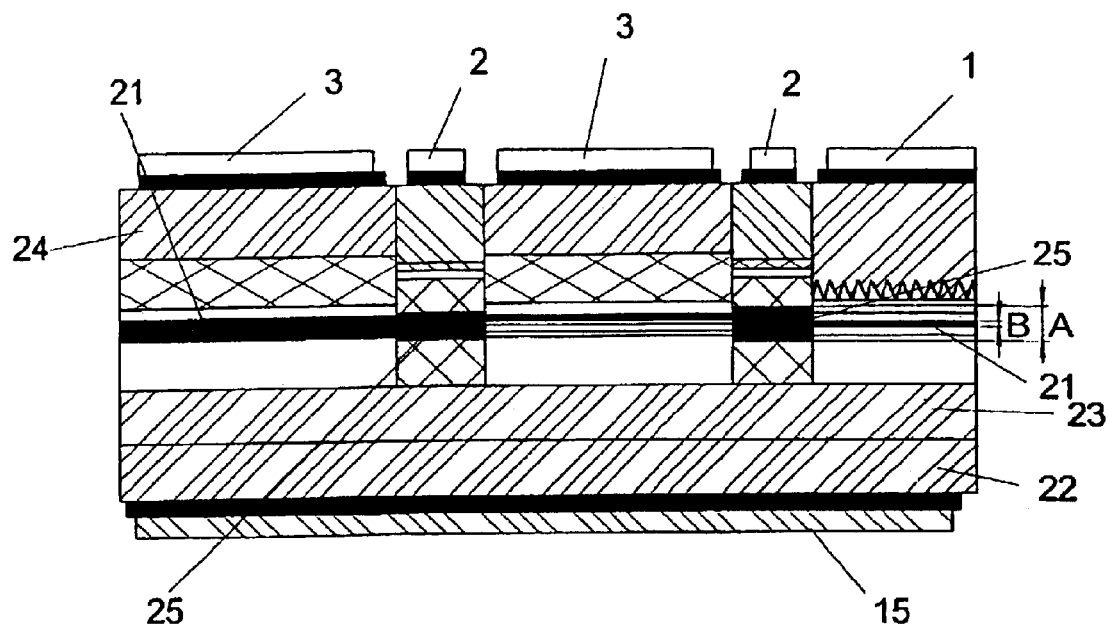
FIG. 6 is a diagrammatic sectional view of a sixth embodiment of an optoelectronic component according to the invention.

FIG. 6 illustrates a sectional view along the waveguide 20 as is present e.g. in the case of the first embodiment (FIG. 1).

In this case, a modulator layer 25 and the further layers of the electroabsorption modulator 2 have different layer thicknesses than the adjacent layers of the laser diode 1 of the optical amplifiers 3. The modulator layer 25 and the active layers of the laser diode 1 and of the optical amplifier 3 are designed as multiple quantum well structures. As an alternative, quantum dot structures may also be used.

The thickness of the modulator layer 25 is designated by A, and the thickness of the active layer is designated by B. The relationships and the layer sequence are explained in more detail in connection with FIG. 7.

The different layer thicknesses mean that the function of the components can be coordinated well with the respective intended use.

Figure 7:
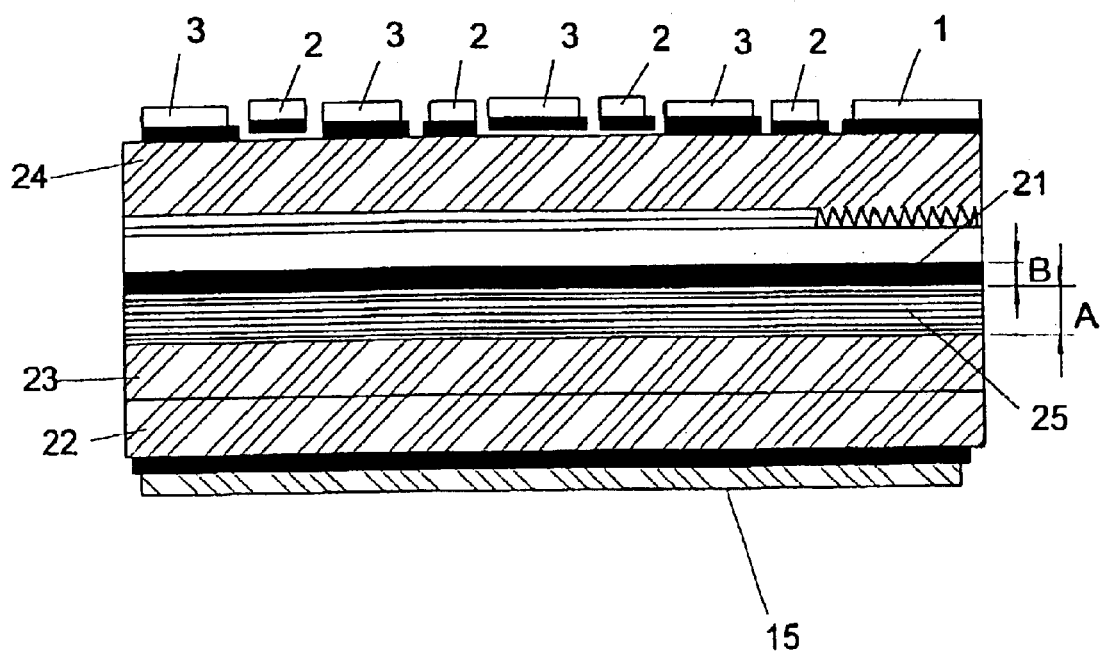
FIG. 7 is a diagrammatic sectional view of a seventh embodiment of an optoelectronic component according to the invention.

FIG. 7 describes a seventh embodiment of the subject matter according to the invention, which, in the horizontal arrangement, has an arrangement of the components 1, 2, 3 analogous to FIG. 6.

A laser diode 1 and two pairs of an electroabsorption modulator 2 and an optical amplifier 3 are arranged from right to left.

At the very bottom, the layer structure has a semi-insulating substrate 22, on which a ground connection 15 is vapor-deposited.

n-doped layers 23 are grown epitaxially on the semi-insulating substrate 22.

In this case, however, the layer sequence is designed such that all the layers have the same thickness in the horizontal direction, which leads to a considerable simplification of production since the layers can be produced in one epitaxy step.

An MQW layer (multiple quantum well layer) as modulator layer 25, which is provided for the electroabsorption modulator 2, is grown on n-doped epitaxially grown layers 23 as substrate. The thickness A of the modulator layer 25 is between approximately 0 and 500 nm.

An active layer 21 (likewise an MQW structure) is arranged as active layer for the laser diode 1. The active layer has a thickness B of 0 to 500 nm.

The following holds true for the ratio of the layer thicknesses:

$$0 > \frac{B}{A+B} \geq 1$$

The minimum value corresponds to a relatively thick modulator layer 25 compared with the active layer 21; the maximum value 1 corresponds to an exclusively active layer 21. These details can be applied mutatis mutandis to all the other exemplary embodiments, and, with analogous interpretation, also to the layer arrangement in accordance with FIG. 6.

In principle, a quantum dot structure can also be used instead of an MQW structure (active layer or modulator layer).

In this embodiment, in contrast to the known integrated structures, the components 1, 2, 3 of the opto-electronic device are coupled via at least one active layer 21.

In the present example there are two layers, namely the modulator layer 25 and the active layer 21, which have an MQW structure, these MQW structures being composed of different quantum well types (two or more).

The active layer 21 and the modulator layer 25 can be produced in an epitaxy process. This results in a significant simplification during production.

p-doped layers 24 are arranged above the active layer 21.

The embodiments illustrated in FIGS. 6 and 7 have a laser diode 1 with a DFB structure (DFB, distributed feedback) or a DBR structure (DBR, distributed Bragg reflector).

It will be understood that the embodiment of the invention is not restricted to the preferred exemplary embodiments specified above. Rather, a number of variants are conceivable which make use of the optoelectronic component according to the invention in the case of embodiments of fundamentally different configuration, as well.

I claim:

1. An optoelectronic component, comprising:

at least one monolithically integrated laser diode;

a plurality of electro-optical modulators;

at least one monolithically integrated optical waveguide functionally coupled to at least two of said electro-optical modulators; and at least one optical amplifier assigned to at least one of said electro-optical modulator.

2. The optoelectronic component according to claim 1, wherein said electro-optical modulators are electro-absorption modulators.

3. The optoelectronic component according to claim 2, wherein said at least two electro-absorption modulators are arranged along said optical waveguide.

4. The optoelectronic component according to claim 2, wherein at least one said optical amplifier is arranged between two said electro-absorption modulators.

5. The optoelectronic component according to claim 2, wherein at least one electro-absorption modulator has a length of less than 150 $\mu$m.

6. The optoelectronic component according to claim 2, which comprises an electronic control circuit connected to at least one of said electro-absorption modulators through a traveling wave contact.

7. The optoelectronic component according to claim 2, wherein a length of said electro-absorption modulators is equal to or shorter than a length of said optical amplifier.

8. The optoelectronic component according to claim 1, wherein said laser diode, said electro-optical modulators, and said optical amplifier are commonly integrated in a common monolithic component.

9. The optoelectronic component according to claim 8, which comprises a common active layer functionally coupling said monolithically integrated components.

10. The optoelectronic component according to claim 9, wherein said active layer is formed with at least one of a plurality of multiple quantum well structures of different quantum well types and quantum dot structures.

11. The optoelectronic component according to claim 1, which comprises an optical amplifier disposed at an end of said optical waveguide.

12. The optoelectronic component according to claim 1, wherein at least one optical waveguide and at least one electrical waveguide are arranged on different substrates.

13. The optoelectronic component according to claim 1, wherein said laser diode, said electro-optical modulators, and said optical amplifier are monolithically integrated components formed of material systems selected from the group consisting of InGaAsP/InP, InGaAlAs/InP, InGaAsN/GaAs, and InGaAlAs/GaAs.

* * * * *